United States Patent [19]
Concorso

[11] Patent Number: 5,994,956
[45] Date of Patent: Nov. 30, 1999

[54] INDUCTIVE-CAPACITIVE FEEDBACK COMPENSATION FOR AMPLIFIER SYSTEMS

[76] Inventor: James A. Concorso, 1007 Rector Rd., Bridgewater, N.J. 08807-1317

[21] Appl. No.: 09/072,722
[22] Filed: May 6, 1998
[51] Int. Cl.⁶ .................................................... H03F 1/34
[52] U.S. Cl. .......................................... 330/107; 330/109
[58] Field of Search .................................. 330/107, 109, 330/294, 302

[56] References Cited

U.S. PATENT DOCUMENTS

| | | | |
|---|---|---|---|
| 3,816,661 | 6/1974 | Huszty et al. | 330/109 X |
| 4,002,994 | 1/1977 | Fender | 330/107 |
| 4,470,020 | 9/1984 | Mohr | 330/107 X |
| 5,072,200 | 12/1991 | Ranky | 330/109 X |

OTHER PUBLICATIONS

Burr–Brown IC Applications Handbook, 1994, pp. 194 to 206.

*Primary Examiner*—Steven J. Mottola

[57] ABSTRACT

The present invention is a device for feedback compensation in amplifiers having at least one voltage gain stage wherein both capacitive and inductive components are used in conjunction with resistive components. There is a first resistor, connected between the output node and the feedback node of the amplifier system, a capacitor, connected in parallel with the first resistor, a second resistor, and an inductor, connected in series with said second resistor. The series combination of the second resistor and the inductor is connected between the feedback node and the reference potential of the amplifier system (usually system common for a non-inverting amplifier system, or the input signal source for an inverting amplifier system). The capacitor advances the phase angle of the current flowing through the feedback network device while the inductor advances the phase angle of the voltage appearing between the feedback node of the amplifier system and the reference potential of same.

20 Claims, 5 Drawing Sheets

INDUCTIVE-CAPACITIVE FEEDBACK COMPENSATION FOR AMPLIFIER SYSTEMS

BACKGROUND OF THE INVENTION

1. Field of the Invention

The present invention relates to a method of feedback compensation for amplifiers wherein both capacitive and inductive components are used in conjunction with resistive components. It is directed to the degenerative feedback loop of an amplifier system where lost phase must be restored to the feedback signal in order to avoid oscillation.

2. Information Disclosure Statement

Before proceeding, it is important that the reader be aware of the context in which the terms "closed-loop gain," "feedback node," and "network divider ratio" will be used. Unless otherwise noted, "closed-loop gain" refers to non-inverting closed-loop gain for the purpose of this patent. Often called "noise gain" in other publications, non-inverting closed-loop gain is the pertinent term to both the stability and the gain error of any feedback amplifier system, even where said amplifier system is configured as an inverter. In publications where inverting amplifiers in particular are discussed, the term "summing node" is often substituted for the term "feedback node" because an inverting amplifier system sums the input signal with the feedback signal at its inverting input. To avoid the need for parallel terminology in this patent, the term "feedback node" is used to signify the inverting input, regardless of whether the system being discussed functions as a non-inverting amplifier or an inverting amplifier. Finally, be advised that the term "network divider ratio" has been created for this patent to denote what is referred to in other publications as "one-over-beta." The term "beta" by itself represents the quotient of the value of the divider resistor over the sum of the values of the feedback resistor and the divider resistor; its use requires repeated reference to its reciprocal, "one-over-beta." Convoluted terms tend to be counter-intuitive, e.g. substituting the phrase "not unlike" for the word "like." The term "network divider ratio," on the other hand, refers to the quotient of the sum of the values of the feedback resistor and the divider resistor over the value of the divider resistor; it need not be inverted. Incidentally, although a ratio is generally called out as two numbers, e.g. "10-to-1" or "10:1," the network divider ratio is expressed as a single number. So, if an amplifier system has a feedback resistance of 900 ohms and a divider resistance of 100 ohms, the network divider ratio is said to be "10."

The table that follows shows definitions for algebraic terms which were created to explain the background art as well as the present invention.

TABLE 1

| TERM | DEFINITION |
|---|---|
| Acl | CLOSED-LOOP GAIN |
| Aol | OPEN-LOOP GAIN |
| Cfb | FEEDBACK CAPACITANCE |
| D | NETWORK DIVIDER RATIO |
| Dφ | NETWORK DIVIDER RATIO AT THE INTERCEPT |
| ÷Err | ERROR RATIO |
| Fφ | INTERCEPT FREQUENCY |
| Ldiv | DIVIDER INDUCTANCE |
| Rdiv | DIVIDER RESISTANCE |
| Rese | ELEMENT OF SERIES EQUIVALENT RESISTANCE |

TABLE 1-continued

| TERM | DEFINITION |
|---|---|
| Rfb | FEEDBACK RESISTANCE |
| θ$_{Conventional}$ | PHASE ANGLE OF CONVENTIONAL FEEDBACK COMPENSATION |
| θ$_{Inet}$ | PHASE ANGLE OF NETWORK CURRENT |
| θ$_p$ | PHASE ANGLE OF THE PRESENT INVENTION |
| θ$_{Vdiv}$ | PHASE ANGLE OF DIVIDER VOLTAGE |
| Verr | ERROR VOLTAGE |
| Vin | INPUT VOLTAGE |
| Vout | OUTPUT VOLTAGE |
| Z$_{Cfb}$ | IMPEDANCE OF FEEDBACK CAPACITANCE |
| Zdiv | OVERALL DIVIDER IMPEDANCE |
| Zese | ELEMENT OF SERIES EQUILAVENT IMPEDANCE |
| Z$_{Ldiv}$ | IMPEDANCE OF DIVIDER INDUCTANCE |
| Znet | OVERALL NETWORK IMPEDANCE |

Since their inception, solid state amplifiers have needed degenerative feedback to correct their rather large gain errors. Degenerative feedback is a means of error minification wherein the output signal is fed back to the input stage of an amplifier for comparison to the original input signal. The difference between these signals, called the "error signal," is then minified by subsequent phase-inversion and amplification. It would be even more illustrative (and more to the point) to say that the error signal is what actually drives the output to the desired amplitude; the amplifier's input stage is "satisfied" when the error signal (when multiplied by the open-loop gain) is sufficient to support the output potential. One might say that the loop is in a state of "equilibrium" at this point. It is important to remember that that which is called the "error signal" is not entirely non-linear. Minification of said signal is still a desirable goal inasmuch as it does contain some error. As such, system performance is enhanced when a large ratio exists between open-loop gain and closed-loop gain, thereby minifying the error signal in relation to the input signal. Moreover, system performance can be predicted by computing the ratio of the error signal to the input signal. Nevertheless, from a conceptual standpoint, it is useful to point out that if a perfect amplifier with no gain error actually existed, there would be no need for large amounts of open-loop gain. For informational purposes, a complete algebraic derivation of the error ratio (÷Err) is shown in Derivation 1. The final equation is shown in boldface at the bottom.

DERIVATION 1

$$\div Err = \frac{Verr}{Vin}$$

$$Verr = \frac{Vout}{Aol}$$

$$Acl = \frac{Vout}{Vin}$$

$$Vin = \frac{Vout}{Acl}$$

$$\div Err = \frac{\frac{Vout}{Aol}}{\frac{Vout}{Acl}}$$

$$\div Err = \frac{Vout}{Aol} \times \frac{Acl}{Vout}$$

-continued $$\div Err = \frac{Acl}{Aol}$$

When the desired closed-loop gain is unity, a direct connection is made between the amplifier output and the feedback node. Closed-loop gains greater than one are set by using a pair of resistors to divide the output signal for application to the feedback node, thus causing the amplifier to drive the output potential further in its quest for equilibrium. At frequencies where the open-loop gain of the amplifier system is high in relation to the closed-loop gain, the closed-loop gain is almost equal to the network divider ratio. In fact, it is common to treat these terms as though they were absolutely equal, although the closed-loop gain is always less than the network divider ratio.

Again, for informational purposes, a complete algebraic derivation of closed-loop gain (Ac1) is shown in Derivation 2. As before, the final equation is shown in boldface at the bottom.

DERIVATION 2

$$Acl = \frac{Vout}{Vin}$$

$$\frac{Vout}{Aol} = Vin - \frac{Vout}{D}$$

$$\frac{Vout}{Aol} + \frac{Vout}{D} = Vin$$

$$Vout = \left[\frac{1}{Aol} + \frac{1}{D}\right] = Vin$$

$$\frac{Vout}{Vin} = \frac{1}{\frac{1}{Aol} + \frac{1}{D}}$$

$$Acl = \frac{1}{\frac{1}{Aol} + \frac{1}{D}}$$

$$Acl = \frac{1}{\frac{D + Aol}{AolD}}$$

$$Acl = \frac{AolD}{D + Aol}$$

As mentioned, greater ratios of open-loop gain to closed-loop gain directly result in higher performance because the larger amounts of inverted magnification exerted on the error signal allow the amplifier to "see" and minify smaller errors. Hence, the true closed-loop gain becomes progressively closer to the network divider ratio. More importantly, any nonlinearity in the transfer function of open-loop gain becomes smaller in proportion to the input signal.

Because the open-loop gain of an amplifier decreases with increasing frequency, it will equal the network divider ratio at some point. The frequency at which this equality of open-loop gain to network divider ratio is reached is called the intercept frequency. The amplifier must not exhibit too much time delay while processing the feedback signal, otherwise its output will overshoot the desired voltage during its attempt to "satisfy" its feedback node. If the time lag of the amplifier is so large that it delays the propagation of the feedback signal by one half-cycle of the intercept frequency, the amplifier will oscillate. Despite popular belief, oscillation can only occur under said conditions.

Rather than delving into specifics prematurely, we can gain an appreciation for oscillation in the abstract with the following example. Imagine that you are colorblind and that you are staring at a flashing light. The light color, you are told, alternates between red and green; there is a brief moment during the transition of color where the light does not glow at all, hence the "flashing." There is a pushbutton connected to the light which enables you to change its color manually. You are told to press the button every time the light is about to turn green so that the light will continue to glow red. Since you are colorblind, you perform your task based on the premise that the light cycle begins with the color red and that the light color will have changed immediately following each period of darkness. In this example, the light represents the amplifier output, the pushbutton represents the feedback node, and you are the feedback loop. The color red represents an amplifier which is stable; it does not oscillate.

Now imagine that there is a time lag in the electronic processing of the pushbutton signal. In spite of your promptness in depressing the button, the light will briefly display the color green; longer electronic delays will result in longer intervals of green. The additional flashes of darkness caused by the errant appearances of the color green are no more than a minor annoyance to you. By using your natural sense of time and your familiarity with the fundamental rhythm of the flashing light, you successfully ignore the "wrong" periods of darkness and faithfully push the button on the "right" ones. In this circumstance, the "amplifier" is still stable, but not as stable as before. The brief appearances of the color green represent what is known in amplifier jargon as "overshoot." Still, the "amplifier" is not oscillating. The interval where the color red appears is three times as long as the interval where the color green appears. In other words, the color green is displayed during one-quarter of the total light cycle. Again speaking in amplifier lingo, this would compute as 25% overshoot.

Now imagine that the time delay is so long that it equals one full color interval, or one-half of the total light cycle. As before, you press the button when the light goes out. However, the electronic time delay is so great that by the time the signal reaches the light, the full green interval has run, and the light, which is about to turn red, is directed by the tardy signal to turn green again. At the end of the errant green cycle, you push the button again, sustaining a color that you thought was red. Under these conditions, the color red will never be displayed, and the light will glow green during the entire light cycle. The feedback, which was supposed to be "degenerative" to the color green, is now "regenerative," and the "amplifier" is oscillating. Notice that your colorblind eyes can only fool you into sustaining the wrong color when the pushbutton time delay is equal to one-half of the light cycle. You have no way of distinguishing a one-half cycle delay from zero delay.

Returning to the discussion of feedback amplifier systems, please note that the distinction between seconds and degrees is an important one. A time delay which is caused by a single reactance can at most only delay the phase of a signal by less than 90°, or one-quarter of a cycle. Lengthening the delay in seconds beyond that point only serves to attenuate the signal amplitude rather than further delaying its phase. Thus, a composite delay comprising more than one reactance is necessary for oscillation to occur in a feedback amplifier system.

To gain an appreciation of this, observe the action of a sine wave driving a capacitor through a series resistor. As the driven end of the resistor is elevated above zero volts, the capacitor, empty of charge, stifles the initial onset of the observed waveform. If the capacitor will accept a charge at all within the waveform period, it must begin before the driven end of the resistor reaches its peak. The excursion of the driven wave beyond that point towards the peak elevates the observed amplitude. The observed amplitude can certainly not be expected to rise while the amplitude at the driven end of the charging resistor is falling.

Having said this, the reader might be inclined to believe that oscillation is a rare malfunction and is of little concern. However, as desirable as it is to increase the ratio of open-loop gain to closed-loop gain, the intercept frequency also increases, making it all the more probable that the propagation delay on the part of the amplifier will be a composite one. The problem worsens if another amplifier stage is added within the same feedback loop, thus further compounding the propagation delay and increasing the risk of oscillation. Moreover, critical system parameters can vary significantly during strenuous operation, such as driving a capacitive load, making the appearance of oscillation even more likely. It is for these reasons that we can understand the inherent drawback of degenerative feedback.

Several techniques have been developed to avoid composite delay-induced oscillation. One of the more popular techniques is known as feedback compensation. The purpose of feedback compensation is to cause the feedback node of a linear amplifier to reach a desired peak voltage sooner than its output does. Recalling the previous red light/green light example, this would be analogous to being told in advance exactly what the pushbutton time delay was and then compensating for the delay by depressing the button that much earlier than usual. In an amplifier system, this is accomplished by creating an artificial peak from a portion of the output cycle which precedes the actual peak.

The conventional method for advancing the phase of a feedback signal is to place a capacitor in parallel with the feedback resistor. Typically, the capacitor has a negligible effect on the network divider ratio in the expected frequency range of input signals. However, as the intercept frequency is approached, the capacitor causes a phase-dependent reduction of the network divider ratio. Empty of charge, the capacitor can produce a voltage on the feedback node whose instantaneous value is limited only by the output amplitude itself. At some point, the capacitor's demand for current must subside to allow the feedback node voltage to decay. This is necessary to preserve the illusion that the peak was here and gone, in spite of the fact that it actually hasn't happened yet. The lower the network divider ratio, the less the artificial peak will contrast the voltage imposed by the resistive elements in the feedback network. Thus, the technique can only make a substantial contribution of phase margin to an amplifier system where the network divider ratio is sufficiently high.

By perusing the prior art, it appears that conventional feedback compensation is misunderstood, at least from a mathematical standpoint. For example, in an article in *Burr-Brown® 1994 Applications Handbook*, entitled "Feedback Plots Define Op Amp AC Performance", at Page 194 et seq., author Jerald Graeme asserts that the maximum capacitor value in conventional feedback compensation is limited by the potential for encountering "secondary-amplifier poles," which, stated in the more lucid terminology of this patent, refers to the excessive phase shift caused by a composite propagation delay. This statement ignores the more fundamental fact that the phase angle of current to voltage recedes as the ratio of capacitor impedance to series resistance decreases. Also, in the same article, Jerald Graeme claims that with a network divider ratio of 1001, the phase angle of conventional feedback compensation will be 45°. In actuality, at said network divider ratio, a correctly optimized embodiment of conventional feedback compensation exhibits an 86.3793125913° phase angle. Thus, it is appropriate to explain the correct usage of conventional feedback compensation before proceeding to a discussion of the present invention.

The phase angle of current to voltage advances when the ratio of capacitor impedance to parallel resistance decreases. Even without converting the network into equivalent series elements, it is clear that if the ratio of $Z_{Cfb}$ (the impedance of the feedback capacitance) to Rfb (the feedback resistance) is decreased, the phase angle will increase.

The phase angle of current to voltage recedes when the ratio of capacitor impedance to series resistance decreases. Therefore, as the ratio of $Z_{Cfb}$ to the combined parallel resistance of Rfb and Rdiv (the divider resistance) decreases, the phase angle decreases. At first glance, this might seem incorrect because only Rdiv is in series with Cfb. However, consider that Cfb is injecting a leading current into Rdiv as a result of either taking on or giving up charge. Two things affect the ability of Cfb to charge; one is the presence of Rdiv in series with it, supplying charge current from the output voltage. The other is the presence of Rfb, limiting the maximum possible voltage across the capacitor itself. A capacitor is regarded as "charged" when it reaches some predetermined portion of its maximum attainable voltage. Observe that the current from Rdiv originates from a voltage source which is higher than the capacitor can possibly reach: the output node. This inequality between the output voltage and the maximum attainable capacitor voltage means that the capacitor will reach a given voltage sooner than anticipated, as though Rdiv were somewhat lower in value. Indeed, the apparent value of Rdiv is scaled down from its actual value by exactly the ratio of Rfb to the sum of Rfb and Rdiv. Hence, in essence, Cfb is in series with the parallel combination of Rfb and Rdiv.

The phase angle of conventional feedback compensation (represented below by the term "$\theta_{Conventional}$") is equal to the difference between the arccotangents of the aforementioned two ratios:

$$\theta_{Conventional} = \text{arccotan}\frac{Z_{Cfb}}{Rfb} - \text{arccotan}\frac{Z_{Cfb}}{\frac{RfbRdiv}{Rfb + Rdiv}}$$

The optimum impedance for the compensating capacitor is equal to the feedback resistance divided by the square root of the network divider ratio:

$$Z_{Cfb} = \frac{Rfb}{\sqrt{D}}$$

In light of the reduction in the network divider ratio, one might expect the resultant increase of the intercept frequency to degrade system stability. However, this negative effect of feedback compensation is outweighed in an amplifier system which exhibits a composite delay. Such a system exhibits a decrease in open-loop gain with increasing frequency which is steeper than the decrease in the network divider ratio.

Notwithstanding the prior art, it appears that the present invention concept wherein both capacitive and inductive components are used to advance the phase of a feedback signal is neither taught nor suggested.

SUMMARY OF THE INVENTION

The present invention is a device for feedback compensation in amplifiers having at least one voltage gain stage wherein both capacitive and inductive components are used in conjunction with resistive components. There is a first resistor, connected between the output node and the feedback node of the amplifier system, a capacitor, connected in parallel with the first resistor, a second resistor, and an inductor, connected in series with said second resistor. The series combination of the second resistor and the inductor is connected between the feedback node and the reference potential of the amplifier system (usually system common for a non-inverting amplifier system, or the input signal source for an inverting amplifier system). The capacitor advances the phase angle of the current flowing through the feedback network device while the inductor advances the phase angle of the voltage appearing between the feedback node of the amplifier system and the reference potential of same.

BRIEF DESCRIPTION OF THE DRAWINGS

The present invention as described in the specification herein is more fully understood when taken in conjunction with the drawings appended hereto.

Thus.

DETAILED DESCRIPTION OF THE PRESENT INVENTION

The present invention relates to a method of feedback compensation in which both a capacitor and an inductor are used to enhance the phase margin of a feedback amplifier system. It possesses several advantages over conventional feedback compensation:

1. Given the same system parameters, the present invention can contribute nearly twice the phase margin to an amplifier system than is possible with conventional feedback compensation arrangements.
2. The present invention is ideally suited for amplifier systems with very low closed-loop gains. With a network divider ratio of only two, the present invention can contribute as much as 27.69° to the phase margin of an amplifier system.
3. Where capacitive loads must be driven, amplifier performance parameters such as bandwidth, differential gain, differential phase, and output admittance need not be degraded to attain a stable system.

Figure 1:
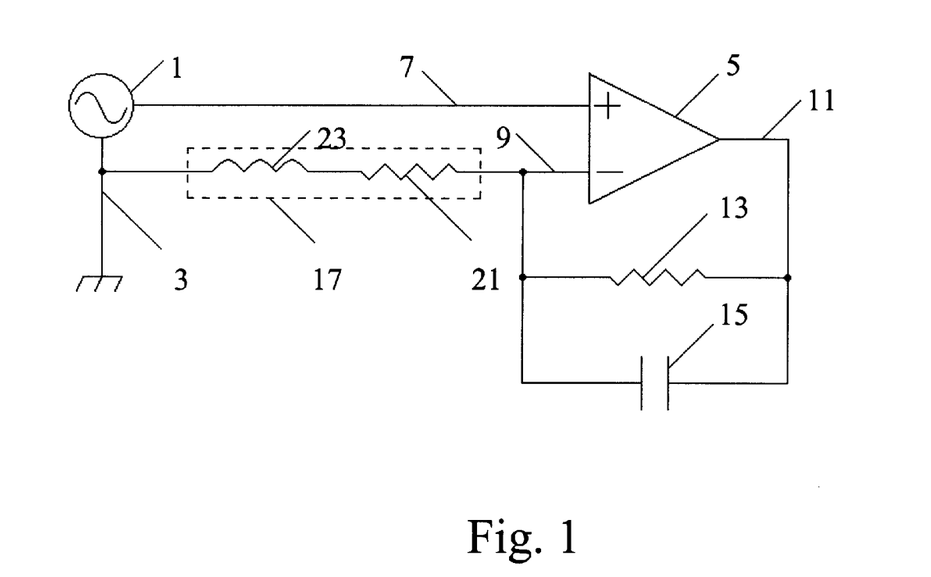
FIG. 1 shows a schematic diagram of the present invention as it pertains to a non-inverting amplifier system, wherein the divider is arranged with the divider resistor connected to the inverting input of said amplifier system.
Figure 3:
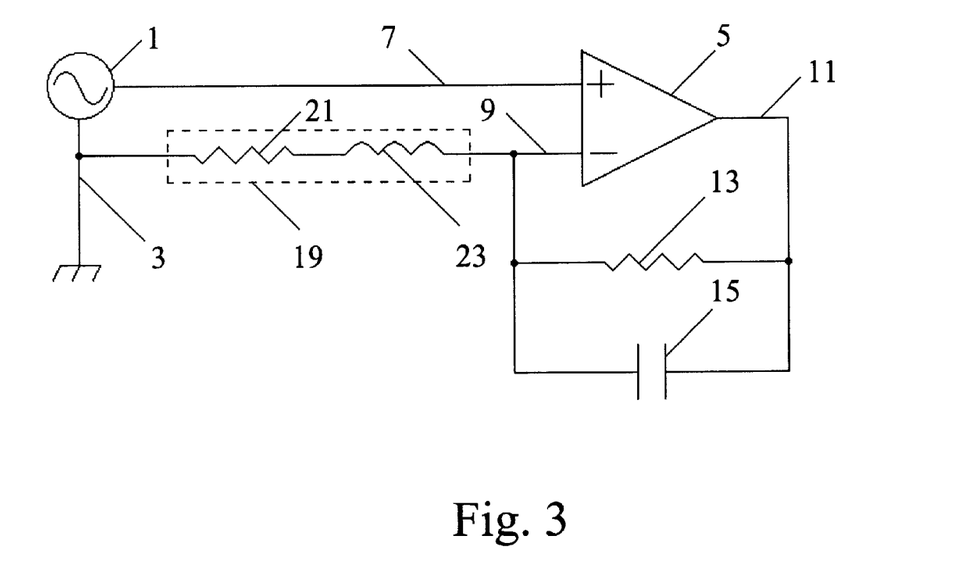
FIG. 3 shows a schematic diagram of the present invention as it pertains to a non-inverting amplifier system, wherein the divider is arranged with the divider inductor connected to the inverting input of said amplifier system.

Referring to FIGS. 1 and 3, a feedback compensation method of the present invention as it relates to a non-inverting amplifier system comprises an amplifier system 5, with its non-inverting input 7 receiving incoming signal 1, said signal being returned to system common 3. There is a feedback resistor 13, connected between output 11 and inverting input 9 of amplifier system 5; a feedback capacitor 15, connected in parallel with feedback resistor 13; and a divider comprising the series combination of a resistor and an inductor connected between inverting input 9 of amplifier system 5 and system common 3, the orientation of which is arbitrary; FIG. 1 has divider 17 oriented with divider resistor 21 connected to input 9 of amplifier system 5 and divider inductor 23 connected to system common 3, whereas FIG. 3 has divider 19 oriented with divider inductor 23 connected to input 9 of amplifier system 5 and divider resistor 21 connected to system common 3.

Figure 2:
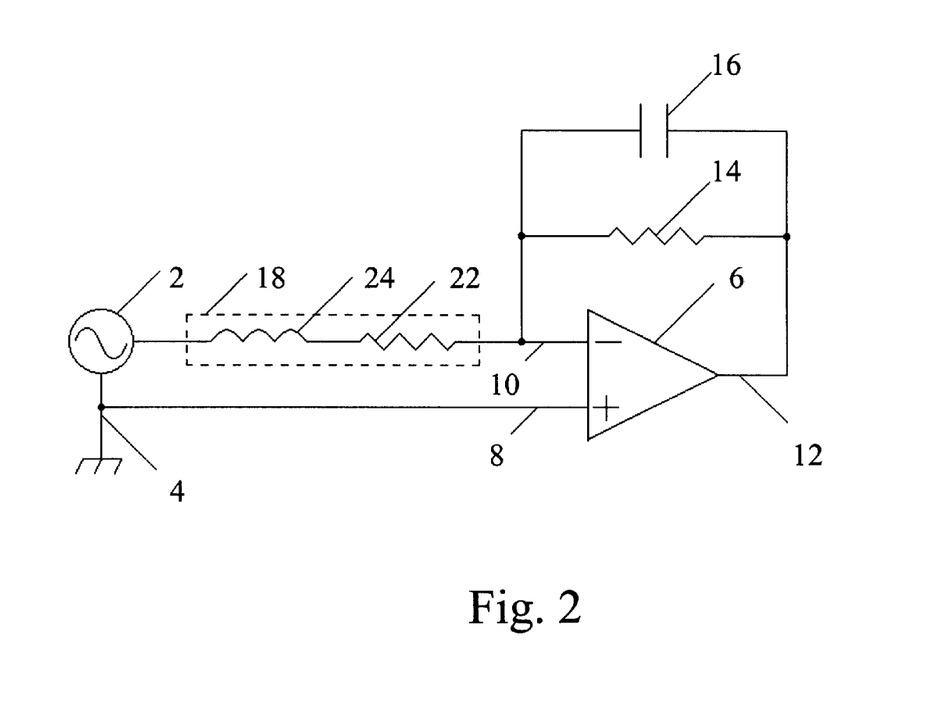
FIG. 2 shows a schematic diagram of the present invention as it pertains to an inverting amplifier system, wherein the divider is arranged with the divider resistor connected to the inverting input of said amplifier system.
Figure 4:
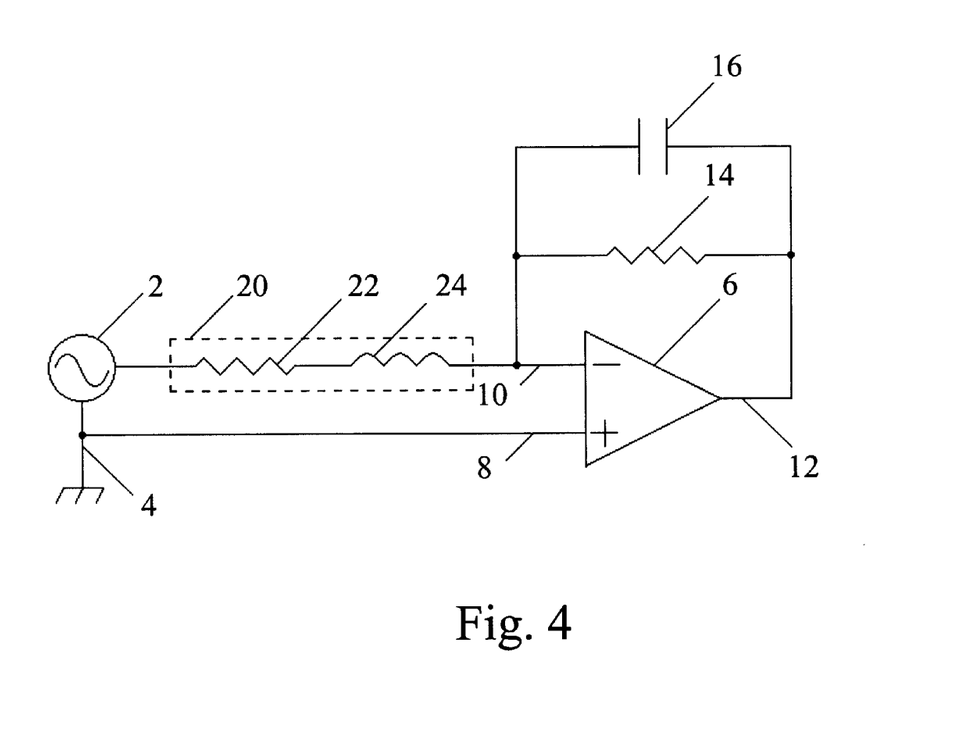
FIG. 4 shows a schematic diagram of the present invention as it pertains to an inverting amplifier system, wherein the divider is arranged with the divider inductor connected to the inverting input of said amplifier system.

Referring now to FIGS. 2 and 4, a feedback compensation method of the present invention as it relates to an inverting amplifier system comprises an amplifier system 6, with its non-inverting input 8 connected to system common 4. There is a feedback resistor 14, connected between output 12 and inverting input 10 of amplifier system 6; a feedback capacitor 16, connected in parallel with feedback resistor 14; and a divider comprising the series combination of a resistor and an inductor connected between inverting input 10 of amplifier system 6 and incoming signal 2, the orientation of which is arbitrary; FIG. 2 has divider 18 oriented with divider resistor 22 connected to input 10 of amplifier system 6 and divider inductor 24 connected to incoming signal 2, whereas FIG. 4 has divider 20 oriented with divider inductor 24 connected to input 10 of amplifier system 6 and divider resistor 22 connected to incoming signal 2. In both FIG. 2 and FIG. 4, incoming signal 2 is returned to system common 4.

The present invention is unique in that phase is advanced by two distinctly separate phenomena: the leading current from the capacitor and the leading voltage from the inductor. The network characteristics are more easily analyzed by first converting Rfb and $Z_{Cfb}$ into equivalent series elements. That is, we will suppose that a series impedance and a series resistance exist in the network in place of Rfb and Cfb, and that said impedance and said resistance in combination produce the same total impedance and the same phase shift as the actual parallel elements which they represent. To accomplish this, two equations are needed: one which expresses Zese (the element of series equivalent impedance) in terms of Rfb and $Z_{Cfb}$; the other which expresses Rese (the element of series equivalent resistance) in terms of $Z_{Cfb}$ and Rfb. Accordingly, Derivation 3 is a complete algebraic derivation of Zese, and Derivation 4 is a complete algebraic derivation of Rese.

DERIVATION 3

$$Zese^2 + Rese^2 = \frac{Rfb^2 Z_{Cfb}^2}{Rfb^2 + Z_{Cfb}^2} \qquad [3a]$$

$$\frac{Rese}{Zese} = \frac{Z_{Cfb}}{Rfb} \qquad [3b]$$

$$Rese = \frac{Z_{Cfb} Zese}{Rfb} \qquad [3c]$$

$$Zese^2 + \frac{Z_{Cfb}^2 Zese^2}{Rfb^2} = \frac{Rfb^2 Z_{Cfb}^2}{Rfb^2 + Z_{Cfb}^2} \qquad [3d]$$

-continued $$Zese^2\left[1 + \frac{Z_{Cfb}^2}{Rfb^2}\right] = \frac{Rfb^2 Z_{Cfb}^2}{Rfb^2 + Z_{Cfb}^2} \quad [3e]$$

$$Zese^2 = \frac{Rfb^2 Z_{Cfb}^2}{\left[1 + \frac{Z_{Cfb}^2}{Rfb^2}\right](Rfb^2 + Z_{Cfb}^2)} \quad [3f]$$

$$Zese^2 = \frac{Rfb^4 Z_{Cfb}^2}{(Rfb^2 + Z_{Cfb}^2)(Rfb^2 + Z_{Cfb}^2)} \quad [3g]$$

$$Zese = \frac{Rfb^2 Z_{Cfb}}{Rfb^2 + Z_{Cfb}^2} \quad [3h]$$

The structure of Derivation 3 is as follows:

Equation [3a] expresses the fact that Zese and Rese in series combination produce the same total impedance as Rfb and $Z_{Cfb}$ in parallel combination.

Equation [3b] expresses the fact that Rese and Zese in combination produce the same phase shift as $Z_{Cfb}$ and Rfb in combination.

Equation [3c] is a rearrangement of equation [3b], solving for Rese.

Equation [3d] combines the premises set forth in equations [3a] and [3b], thus eliminating the term Rese. Specifically, the right-hand side of equation [3c] is inserted into equation [3a] in place of the term Rese.

Equations [3e], [3f], and [3g] are intermediate steps toward reducing equation [3d] to the simplified form of [3h], the final equation.

DERIVATION 4

$$Rese^2 + Zese^2 = \frac{Z_{Cfb}^2 Rfb^2}{Z_{Cfb}^2 + Rfb^2} \quad [4a]$$

$$\frac{Zese}{Rese} = \frac{Rfb}{Z_{Cfb}} \quad [4b]$$

$$Zese = \frac{Rfb \cdot Rese}{Z_{Cfb}} \quad [4c]$$

$$Rese^2 + \frac{Rfb^2 Rese^2}{Z_{Cfb}^2} = \frac{Z_{Cfb}^2 Rfb^2}{Z_{Cfb}^2 + Rfb^2} \quad [4d]$$

$$Rese^2\left[1 + \frac{Rfb^2}{Z_{Cfb}^2}\right] = \frac{Z_{Cfb}^2 Rfb^2}{Z_{Cfb}^2 + Rfb^2} \quad [4e]$$

$$Rese^2 = \frac{Z_{Cfb}^2 Rfb^2}{\left[1 + \frac{Rfb^2}{Z_{Cfb}^2}\right](Z_{Cfb}^2 + Rfb^2)} \quad [4f]$$

$$Rese^2 = \frac{Z_{Cfb}^4 Rfb^2}{(Z_{Cfb}^2 + Rfb^2)(Z_{Cfb}^2 + Rfb^2)} \quad [4g]$$

$$Rese = \frac{Z_{Cfb}^2 Rfb}{Z_{Cfb}^2 + Rfb^2} \quad [4h]$$

The structure of Derivation 4 is as follows:

Equation [4a] expresses the fact that Rese and Zese in series combination produce the same total impedance as $Z_{Cfb}$ and Rfb in parallel combination.

Equation [4b] expresses the fact that Zese and Rese in combination produce the same phase shift as Rfb and $Z_{Cfb}$ in combination.

Equation [4c] is a rearrangement of equation [4b], solving for Zese.

Equation [4d] combines the premises set forth in equations [4a] and [4b], thus eliminating the term Zese. Specifically, the right-hand side of equation [4c] is inserted into equation [4a] in place of the term Zese.

Equations [4e], [4f], and [4g] are intermediate steps toward reducing equation [4d] to the simplified form of [4h], the final equation.

With the terms Zese and Rese fully understood, a feedback network device of the present invention can now be analyzed for network divider ratio at the intercept and phase characteristics.

A feedback network device of the present invention is optimized for phase angle at the intercept when the feedback capacitor exhibits an impedance equal to Rfb times the square-root of the quotient 3 divided by D, and the divider inductor exhibits an impedance equal to Rdiv times the square-root of the quotient D divided by 3. It is necessary to compute $D\phi$ (the network divider ratio at the intercept). The purpose of doing so is to enable the intercept frequency ($F\phi$) to be determined, thus allowing values to be assigned to the feedback capacitor and the divider inductor. The equation for $D\phi$ is derived algebraically in Derivation 5.

DERIVATION 5

$$D\phi = \frac{Znet}{Zdiv} \quad [5a]$$

$$Znet = \sqrt{(Zese - Z_{Ldiv})^2 + (Rese + Rdiv)^2} \quad [5b]$$

$$Zdiv = \sqrt{Z_{Ldiv}^2 + Rdiv^2} \quad [5c]$$

$$D\phi = \frac{\sqrt{(Zese - Z_{Ldiv})^2 + (Rese + Rdiv)^2}}{\sqrt{Z_{Ldiv}^2 + Rdiv^2}} \quad [5d]$$

The structure of Derivation 5 is as follows:

Equation [5a] expresses $D\Phi$ as the quotient Znet (the overall network impedance) divided by Zdiv (the overall divider impedance).

Equation [5b] is a detailed expression of Znet in terms of Zese, $Z_{Ldiv}$, Rese, and Rdiv.

Equation [5c] is a detailed expression of Zdiv in terms of ZLdiv and Rdiv.

Equation [5d] is an expanded version of equation [5a] using solutions from equations [5b] and [5c]. Specifically, the right-hand side of equation [5b] is inserted into equation [5a] in place of the term Znet, and the right-hand side of equation [5c] is inserted into equation [5a] in place of the term Zdiv.

As mentioned, the phase lead exhibited by the present invention is caused by the leading current from the capacitor and the leading voltage from the inductor. Phase characteristics of the present invention are expressed in an equation which is derived algebraically in Derivation 6.

DERIVATION 6

$$\theta_p = \theta_{Inet} + \theta_{Vdiv} \quad [6a]$$

$$\theta_{Inet} = \arctangent \frac{Zese - Z_{Ldiv}}{Rese + Rdiv} \quad [6b]$$

-continued $$\theta_{Vdiv} = \arctan \frac{Z_{Ldiv}}{Rdiv} \qquad [6c]$$

$$\theta_\rho = \arctan\frac{Zese - Z_{Ldiv}}{Rese + Rdiv} + \arctan\frac{Z_{Ldiv}}{Rdiv} \qquad [6d]$$

The structure of Derivation 6 is as follows:

Equation [6a] expresses $\theta_\rho$ (the phase angle of the present invention) as the sum of $\theta_{Inet}$ (the phase angle of network current) and $\theta_{Vdiv}$ (the phase angle of divider voltage).

Equation [6b] expresses $\theta_{Inet}$ in terms of Zese, $Z_{Ldiv}$, Rese, and Rdiv.

Equation [6c] expresses $\theta_{Vdiv}$ in terms of $Z_{Ldiv}$ and Rdiv.

Equation [6d] is an expanded version of equation [6a] using solutions from equations [6b] and [6c]. Specifically, the right-hand side of equation [6b] is inserted into equation [6a] in place of the term $\theta_{Inet}$, and the right-hand side of equation [6c] is inserted into equation [6a] in place of the term $\theta_{Vdiv}$.

When a feedback network device of the present invention is optimized for phase angle at the intercept, $Z_{Cfb}$=Rfb$\sqrt{3D}$, and $Z_{Ldiv}$=Rdiv$\sqrt{D/3}$. Said equalities greatly simplify equations for D$\phi$ and $\theta_\rho$ complete algebraic derivation of an equation which expresses D$\phi$ solely in terms of D is given in Derivation 7.

DERIVATION 7

$$Rdiv = 1 \qquad [7a]$$

$$Rfb = D - 1 \qquad [7b]$$

$$Z_{Ldiv} = \sqrt{D/3} \qquad [7c]$$

$$Z_{Cfb} = (D-1)\sqrt{3/D} \qquad [7d]$$

$$Rese = \frac{(D-1)^2(D-1)3/D}{(D-1)^2 3/D + (D-1)^2} \qquad [7e]$$

$$Rese = \frac{(D-1)3/D}{3/D + 1} \qquad [7f]$$

$$Rese = \frac{D-1}{1 + D/3} \qquad [7g]$$

$$Zese = \frac{(D-1)^2(D-1)\sqrt{3/D}}{(D-1)^2 + (D-1)^2 3/D} \qquad [7h]$$

$$Zese = \frac{(D-1)\sqrt{3/D}}{1 + 3/D} \qquad [7i]$$

$$Zese = \frac{(D-1)\sqrt{3/D}}{D/3 + 1} \qquad [7j]$$

$$D\phi^2 = \frac{\left[\frac{(D-1)\sqrt{D/3}}{D/3+1} - \sqrt{D/3}\right]^2 + \left[\frac{D-1}{D/3+1} + 1\right]^2}{D/3+1} \qquad [7k]$$

$$D\phi^2 = \frac{D/3 + \frac{(D-1)^2 D/3}{(D/3+1)^2} - 2\frac{(D-1)D/3}{D/3+1} + 2\frac{D-1}{D/3+1} + 1}{D/3+1} \qquad [7l]$$

$$D\phi^2 = \frac{\frac{(D-1)^2 D/3 + (D-1)^2}{(D/3+1)^2} - \frac{2(D-1)D/3 - 2(D-1)}{D/3+1} + D/3 + 1}{D/3+1} \qquad [7m]$$

$$D\phi^2 = \frac{\frac{(D-1)^2(D/3+1)}{(D/3+1)^2} - \frac{2(D-1)D/3 - 2(D-1)}{D/3+1} + D/3 + 1}{D/3+1} \qquad [7n]$$

$$D\phi^2 = \frac{\frac{(D-1)^2 - 2(D-1)(D/3-1)}{D/3+1} + D/3 + 1}{D/3+1} \qquad [7o]$$

$$D\phi^2 = \frac{\frac{(D-1)(D-1-2D/3+2)}{D/3+1} + D/3 + 1}{D/3+1} \qquad [7p]$$

$$D\phi^2 = \frac{\frac{(D-1)(D/3+1)}{D/3+1} + D/3 + 1}{D/3+1} \qquad [7q]$$

$$D\phi^2 = \frac{4D/3}{D/3+1} \qquad [7r]$$

$$D\phi^2 = \frac{4}{1 + 3/D} \qquad [7s]$$

$$D\phi = \frac{2}{\sqrt{1 + 3/D}} \qquad [7t]$$

The structure of Derivation 7 is as follows:

For the purpose of Derivations 7 and 8 only, Rdiv is assigned a value of one, thus allowing Rfb to be expressed as D minus one. This is shown in equations [7a] and [7b], respectively. $Z_{Ldiv}$ and $Z_{Cfb}$ can then be expressed purely in terms of D, as shown in equations [7c] and [7d], respectively.

Equation [7e] is Rese equation [4h], substituting the right-hand side of equations [7d] and [7b] for the terms $Z_{Cfb}$ and Rfb, respectively.

Equation [7f] is an intermediate step towards reducing equation [7e] to the simplified form of equation [7g].

Equation [7h] is Zese equation [3h], substituting the right-hand side of equations [7b] and [7d] for the terms Rfb and $Z_{Cfb}$, respectively.

Equation [7i] is a simplified form of equation [7h].

Equation [7j] is a rearrangement of equation [7i] wherein the denominator is set to match that of Rese equation [7g].

Equation [7k] is D$\phi$ equation [5d] wherein the right-hand side of equation [7a] is substituted for the term Rdiv, the right-hand side of equation [7c] is substituted for the term $Z_{Ldiv}$, the right-hand side of equation [7g] is substituted for the term Rese, and the right-hand side of equation [7j] is substituted for the term Zese.

Equations [7l], [7m], [7n], [7o], [7p], [7q], [7r], and [7s] are intermediate steps toward reducing equation [7k] to the simplified form of [7t], the final equation. Equation [7t] is a valid means of computing D$\phi$ where the equalities $Z_{Cfb}$=Rfb$\sqrt{3/D}$ and $Z_{Ldiv}$=Rdiv$\sqrt{D/3}$ are true.

Portions of Derivation 7 can be used to simplify the phase angle equations of Derivation 6 much as the equation for D$\phi$ was simplified. A complete algebraic derivation of $\theta_\rho$ in terms of D is given in Derivation 8.

DERIVATION 8

$$\theta_{Inet} = \arctan\text{gent} \frac{\frac{(D-1)\sqrt{D/3}}{D/3+1} - \sqrt{D/3}}{\frac{D-1}{D/3+1} + 1} \quad [8a]$$

$$\theta_{Inet} = \arctan \frac{(D-1)\sqrt{D/3} - (D/3+1)\sqrt{D/3}}{D-1+D/3+1} \quad [8b]$$

$$\theta_{Inet} = \arctan\text{gent} \frac{D-1-D/3-1}{(4D/3)\sqrt{3/D}} \quad [8c]$$

$$\theta_{Inet} = \arctan\text{gent} \frac{2D/3-2}{4\sqrt{D/3}} \quad [8d]$$

$$\theta_{Inet} = \arctan\text{gent} \frac{D/3-1}{2\sqrt{D/3}} \quad [8e]$$

$$\theta_{Inet} = \arctan\text{gent} \frac{D-3}{2\sqrt{3D}} \quad [8f]$$

$$\theta_{Vdiv} = \arctan\text{gent}\sqrt{D/3} \quad [8g]$$

$$\theta_\rho = \arctan\text{gent} \frac{D-3}{2\sqrt{3D}} + \arctan\text{gent}\sqrt{D/3} \quad [8h]$$

The structure of Derivation 8 is as follows:

Equation [8a] is $\theta_{Inet}$ equation [6b] wherein the right-hand side of equation [7a] is substituted for the term Rdiv, the right-hand side of equation [7c] is substituted for the term $Z_{Ldiv}$, the right-hand side of equation [7g] is substituted for the term Rese, and the right-hand side of equation [7j] is substituted for the term Zese.

Equations [8b], [8c], [8d], and [8e] are intermediate steps toward reducing equation [8a] to the simplified form of [8f], the final equation for $\theta_{Inet}$.

Equation [8g] is $\theta_{Vdiv}$ equation [6c], substituting the right-hand side of equations [7a] and [7c] for the terms Rdiv and $Z_{Ldiv}$, respectively.

Final equation [8h] is $\theta_\rho$ equation [6a], substituting the right-hand side of equations [8f] and [8g] for the terms $\theta_{Inet}$ and $\theta_{Vdiv}$, respectively. Equation [8h] is a valid means of computing $\theta_\rho$ where the equalities $Z_{Cfb}$=Rfb√3/D and $Z_{Ldiv}$=Rdiv√D/3 are true.

The phase angle of divider voltage advances when the ratio of $Z_{Ldiv}$ to Rdiv increases, and recedes as the ratio of $Z_{Ldiv}$ to the combined series resistance of Rfb and Rdiv increases. It can be appreciated then, that as the value of D decreases, the latter ratio becomes more dominant because the value of Rfb approaches that of Rdiv. Some portion of the current in Cfb is being used to combat this effect. Where $Z_{Cfb}$ and $Z_{Ldiv}$ are optimized, and the network divider ratio is less than three, all of the current in Cfb will be used in this way, and the phase angle of the network current will actually be negative. Nevertheless, the performance-enhancing contributions of Cfb and Ldiv are still as valid. For example, with a network divider ratio of two, conventional feedback compensation can at best only yield 19.4712206343° of phase lead. At the same network divider ratio, the present invention contributes a 27.6945614507° phase lead to an amplifier system, even though the network current is lagging by 11.5369590329°. In other words, when the network divider ratio is less than three, an optimized Cfb still advances the phase angle of network current, but does so by making said angle less negative. Incidentally, an optimized Cfb advances the phase angle of network current (which would otherwise be negative) to zero degrees when the network divider ratio is equal to three, and to a positive value when the network divider ratio is greater than three.

Figure 5:
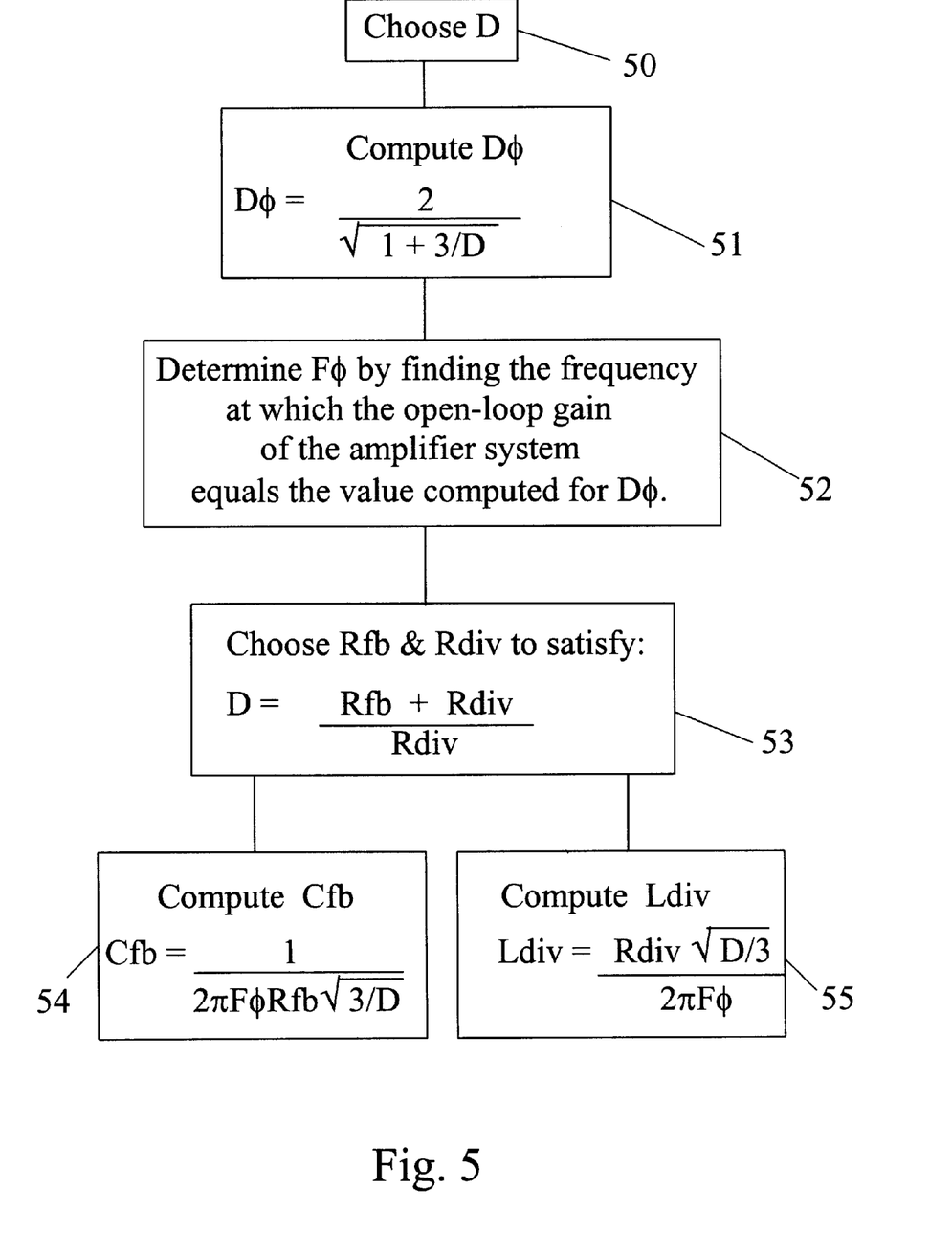
FIG. 5 is a flow diagram giving an optimization procedure by which the present invention can be applied.

Referring to the flow diagram of FIG. 5, a six-step optimization procedure of the present invention is given.

Block 50 contains text describing the first step of said procedure which reads:

CHOOSE

D

Block 51 contains text describing the second step of said procedure which reads:

$$D\phi = \frac{2}{\sqrt{1+3/D}}$$

Block 52 contains text describing the third step of said procedure which reads:

DETERMINE Fφ BY FINDING THE
FREQUENCY AT WHICH THE OPEN-LOOP
GAIN OF THE AMPLIFIER SYSTEM EQUALS
THE VALUE COMPUTED FOR Dφ

Fφ can be found by examining an open-loop gain versus frequency graph of the amplifier system, if available. Or, Fφ can be measured by performing a frequency sweep on the amplifier system and observing the frequency at which its open-loop gain falls to a value equal to that computed for Dφ. In the absence of empirical data, a transfer function equation can be used to compute the value of Fφ. A transfer function equation is a polynomial expression of open-loop gain as a function of frequency; its derivation is particular to the amplifier system of interest.

Block 53 contains text describing the fourth step of said procedure which reads:

CHOOSE Rfb & Rdiv TO SATISFY:

$$D = \frac{Rfb + Rdiv}{Rdiv}$$

Block 54 contains text describing the fifth step of said procedure which reads:

COMPUTE Cfb $$Cfb = \frac{1}{2\pi F\phi Rfb\sqrt{3/D}}$$

Block 55 contains text describing the sixth step of said procedure which reads:

COMPUTE Ldiv $$Ldiv = \frac{Rdiv\sqrt{D/3}}{2\pi F\phi}$$

In the optimization procedure of FIG. 5, the values of Rfb and Rdiv are determined by choice while the values of Cfb and Ldiv are dictated by their respective algebraic relationships to Rfb and Rdiv. It is likely that when utilizing the present invention, the designer will prefer to determine the value of Cfb or Ldiv by choice, and then compute the values of Rfb and Rdiv based on their respective algebraic relationships to Cfb and Ldiv. Accordingly, FIG. 6 is a flow diagram of an optimization procedure wherein the value of Cfb is determined by choice, and FIG. 7 is a flow diagram of an optimization procedure wherein the value of Ldiv is determined by choice.

Figure 6:
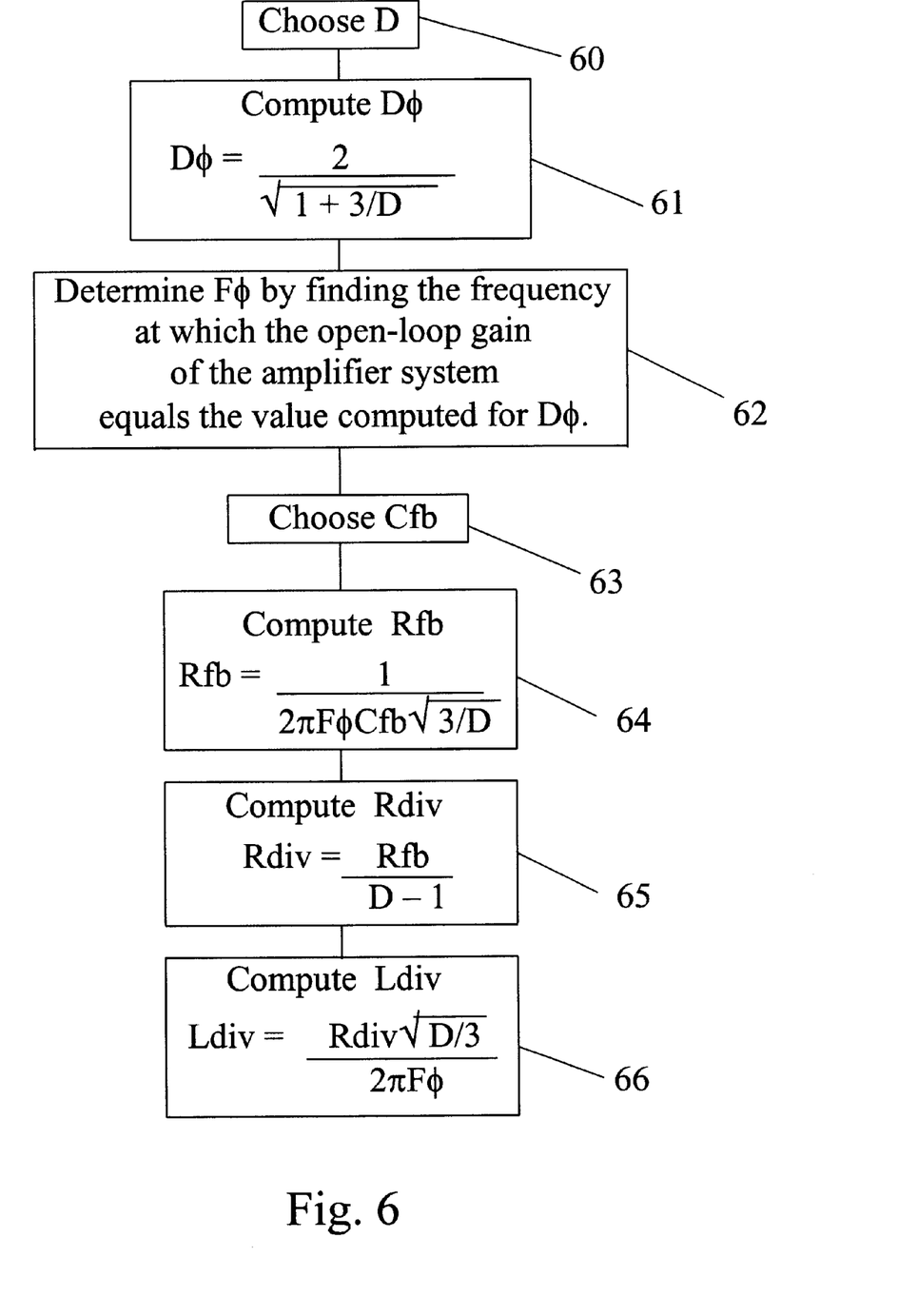
FIG. 6 is a flow diagram giving an optimization procedure wherein the value of Cfb is determined by choice; and, FIG. 7 is a flow diagram giving an optimization procedure wherein the value of Ldiv is determined by choice.
Figure 7:
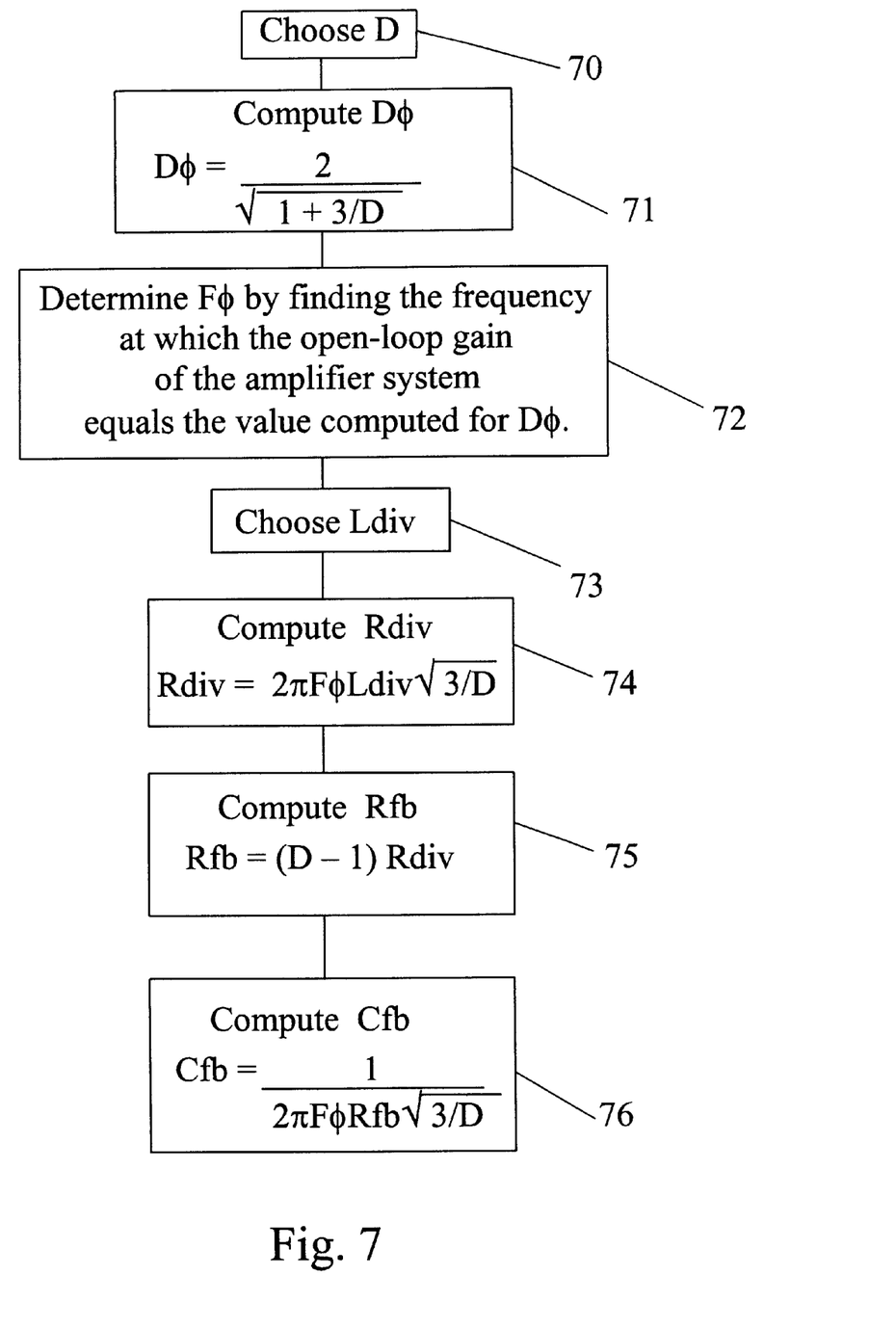

Referring to the flow diagram of FIG. 6, a seven-step optimization procedure of the present invention is given.

Block 60 contains text describing the first step of said procedure which reads:

CHOOSE

D

Block 61 contains text describing the second step of said procedure which reads:

COMPUTE Dφ

$$D\phi = \frac{2}{\sqrt{1+3/D}}$$

Block 62 contains text describing the third step of said procedure which reads:

DETERMINE Fφ BY FINDING THE FREQUENCY AT WHICH THE OPEN-LOOP GAIN OF THE AMPLIFIER SYSTEM EQUALS THE VALUE COMPUTED FOR Dφ

Fφ can be found by examining an open-loop gain versus frequency graph of the amplifier system, if available. Or, Fφ can be measured by performing a frequency sweep on the amplifier system and observing the frequency at which its open-loop gain falls to a value equal to that computed for Dφ. In the absence of empirical data, a transfer function equation can be used to compute the value of Fφ. A transfer function equation is a polynomial expression of open-loop gain as a function of frequency; its derivation is particular to the amplifier system of interest.

Block 63 contains text describing the fourth step of said procedure which reads:

CHOOSE

Cfb

Block 64 contains text describing the fifth step of said procedure which reads:

COMPUTE Rfb $$Rfb = \frac{1}{2\pi F\phi Cfb\sqrt{3/D}}$$

Block 65 contains text describing the sixth step of said procedure which reads:

COMPUTE Rdiv

Rdiv=Rfb/D−1

Block 66 contains text describing the seventh step of said procedure which reads:

COMPUTE Ldiv $$Ldiv = \frac{Rdiv\sqrt{D/3}}{2\pi F\phi}$$

Referring now to the flow diagram of FIG. 7, a seven-step optimization procedure of the present invention is given.

Block 70 contains text describing the first step of said procedure which reads:

CHOOSE

D

Block 71 contains text describing the second step of said procedure which reads:

COMPUTE Dφ

$$D\phi = \frac{2}{\sqrt{1+3/D}}$$

Block 72 contains text describing the third step of said procedure which reads:

DETERMINE Fφ BY FINDING THE FREQUENCY AT WHICH THE OPEN-LOOP GAIN OF THE AMPLIFIER SYSTEM EQUALS THE VALUE COMPUTED FOR Dφ

Fφ can be found by examining an open-loop gain versus frequency graph of the amplifier system, if available. Or, Fφ can be measured by performing a frequency sweep on the amplifier system and observing the frequency at which its open-loop gain falls to a value equal to that computed for Dφ. In the absence of empirical data, a transfer function equation can be used to compute the value of Fφ. A transfer function equation is a polynomial expression of open-loop gain as a function of frequency; its derivation is particular to the amplifier system of interest.

Block 73 contains text describing the fourth step of said procedure which reads:

CHOOSE

Ldiv

Block 74 contains text describing the fifth step of said procedure which reads:

COMPUTE Rdiv

Rdiv=2πFφLdiv√3/D

Block 75 contains text describing the sixth step of said procedure which reads:

COMPUTE Rfb

Rfb=(D−1)Rdiv

Block 76 contains text describing the seventh step of said procedure which reads:

COMPUTE Cfb $$Cfb = \frac{1}{2\pi F\phi Rfb\sqrt{3/D}}$$

It must be understood that when the equalities $Z_{Cfb}$=Rfb $\sqrt{3/D}$ and $Z_{Ldiv}$=Rdiv$\sqrt{D/3}$ do not hold true, the simplified equations for D$\phi$ and $\theta_\rho$ are invalid. Thus, when the value of F$\phi$ deviates from that which was used to optimize Cfb and Ldiv, the relatively complex equations [5d] and [6d] must be used when computing D$\phi$ and $\theta_\rho$, respectively.

Although a network divider ratio of the present invention will exhibit a stronger dependency on frequency than that of conventional feedback compensation, the superior phase characteristics of the present invention make it clearly better overall.

In preferred embodiments, component values are determined by following one of the three optimization procedures set forth in FIGS. 5, 6, and 7, respectively. Some embodiments could further include variable closed-loop gain by means of an adjustable network divider ratio wherein the value of said capacitor and/or the value of said inductor vary in tandem when the value(s) of one or both of said resistors are adjusted so as to preserve critical ratios therebetween thus maintaining optimum compensation.

What is claimed is:

1. A feedback network device for connection to an amplifier system, said amplifier system having at least one voltage gain stage, a reference potential, a feedback node, and an output node, whereby a signal path having a composite propagation delay exists between said feedback node and said output node, said feedback network device comprising:

a first resistor connected between said output node and said feedback node; a capacitor connected in parallel with said first resistor; a second resistor, an inductor, connected in series with said second resistor;

wherein said series combination of said second resistor and said inductor is connected between said feedback node and said reference potential, such that said capacitor advances the phase angle of current flowing through said feedback network device while said inductor advances the phase angle of the voltage appearing between said feedback node and said reference potential.

2. The feedback network device of claim 1 wherein said reference potential is circuit ground.

3. The feedback network device of claim 1 wherein said reference potential is an input signal.

4. The feedback network device of claim 2 wherein said amplifier system has a non-inverting input connected to an input signal.

5. The feedback network device of claim 3 wherein said amplifier system has a non-inverting input connected to circuit ground.

6. The feedback network device of claim 1 wherein said capacitor exhibits an impedance at the intercept substantially equal to the product of the feedback resistance times the square root of the quotient of the fraction that has as its numerator the quantity 3 and has as its denominator D, and said inductor exhibits an impedance at the intercept substantially equal to the product of the divider resistance times the square root of the quotient of the fraction that has as its numerator D and has as its denominator the quantity 3, wherein said D is equal to the quotient of the fraction that has as its numerator the sum of the feedback resistance and the divider resistance and has as its denominator the divider resistance; wherein at the intercept, the network divider ratio decreases to a value substantially equal to the quotient of the fraction that has as its numerator the quantity 2 and has as its denominator the square root of the sum that is one plus the quotient of the fraction that has as its numerator the quantity 3 and has as its denominator D as set forth above.

7. The feedback network device of claim 2 wherein said capacitor exhibits an impedance at the intercept substantially equal to the product of the feedback resistance times the square root of the quotient of the fraction that has as its numerator the quantity 3 and has as its denominator D, and said inductor exhibits an impedance at the intercept substantially equal to the product of the divider resistance times the square root of the quotient of the fraction that has as its numerator D and has as its denominator the quantity 3, wherein said D is equal to the quotient of the fraction that has as its numerator the sum of the feedback resistance and the divider resistance and has as its denominator the divider resistance; wherein at the intercept, the network divider ratio decreases to a value substantially equal to the quotient of the fraction that has as its numerator the quantity 2 and has as its denominator the square root of the sum that is one plus the quotient of the fraction that has as its numerator the quantity 3 and has as its denominator D as set forth above.

8. The feedback network device of claim 3 wherein said capacitor exhibits an impedance at the intercept substantially equal to the product of the feedback resistance times the square root of the quotient of the fraction that has as its numerator the quantity 3 and has as its denominator D, and said inductor exhibits an impedance at the intercept substantially equal to the product of the divider resistance times the square root of the quotient of the fraction that has as its numerator D and has as its denominator the quantity 3, wherein said D is equal to the quotient of the fraction that has as its numerator the sum of the feedback resistance and the divider resistance and has as its denominator the divider resistance; wherein at the intercept, the network divider ratio decreases to a value substantially equal to the quotient of the fraction that has as its numerator the quantity 2 and has as its denominator the square root of the sum that is one plus the quotient of the fraction that has as its numerator the quantity 3 and has as its denominator D as set forth above.

9. The feedback network device of claim 4 wherein said capacitor exhibits an impedance at the intercept substantially equal to the product of the feedback resistance times the square root of the quotient of the fraction that has as its numerator the quantity 3 and has as its denominator D, and said inductor exhibits an impedance at the intercept substantially equal to the product of the divider resistance times the square root of the quotient of the fraction that has as its numerator D and has as its denominator the quantity 3, wherein said D is equal to the quotient of the fraction that has as its numerator the sum of the feedback resistance and the divider resistance and has as its denominator the divider resistance; wherein at the intercept, the network divider ratio decreases to a value substantially equal to the quotient of the fraction that has as its numerator the quantity 2 and has as its denominator the square root of the sum that is one plus the quotient of the fraction that has as its numerator the quantity 3 and has as its denominator D as set forth above.

10. The feedback network device of claim 5 wherein said capacitor exhibits an impedance at the intercept substantially equal to the product of the feedback resistance times the square root of the quotient of the fraction that has as its numerator the quantity 3 and has as its denominator D, and said inductor exhibits an impedance at the intercept substantially equal to the product of the divider resistance times the square root of the quotient of the fraction that has as its numerator D and has as its denominator the quantity 3, wherein said D is equal to the quotient of the fraction that has as its numerator the sum of the feedback resistance and the divider resistance and has as its denominator the divider resistance; wherein at the intercept, the network divider ratio decreases to a value substantially equal to the quotient of the fraction that has as its numerator the quantity 2 and has as its denominator the square root of the sum that is one plus the quotient of the fraction that has as its numerator the quantity 3 and has as its denominator D as set forth above.

11. The feedback network device of claim 1 wherein said amplifier system drives a capacitive load.

12. The feedback network device of claim 2 wherein said amplifier system drives a capacitive load.

13. The feedback network device of claim 3 wherein said amplifier system drives a capacitive load.

14. The feedback network device of claim 4 wherein said amplifier system drives a capacitive load.

15. The feedback network device of claim 5 wherein said amplifier system drives a capacitive load.

16. The feedback network device of claim 6 wherein said amplifier system drives a capacitive load.

17. The feedback network device of claim 7 wherein said amplifier system drives a capacitive load.

18. The feedback network device of claim 8 wherein said amplifier system drives a capacitive load.

19. The feedback network device of claim 9 wherein said amplifier system drives a capacitive load.

20. The feedback network device of claim 10 wherein said amplifier system drives a capacitive load.

* * * * *